(12) United States Patent
Desagulier et al.

(10) Patent No.: US 7,726,015 B2
(45) Date of Patent: Jun. 1, 2010

(54) METHOD OF MAKING ELECTRICALLY CONDUCTIVE PATTERNS ON A SUBSTRATE

(75) Inventors: Christian Desagulier, Paris (FR); Alain Lacombe, Chambourcy (FR); Bruno Esmiller, Villennes sur Seine (FR)

(73) Assignee: Astrium SAS, Paris (FR)

( * ) Notice: Subject to any disclaimer, the term of this patent is extended or adjusted under 35 U.S.C. 154(b) by 215 days.

(21) Appl. No.: 11/815,528

(22) PCT Filed: Feb. 20, 2006

(86) PCT No.: PCT/FR2006/000374

§ 371 (c)(1),
(2), (4) Date: Aug. 3, 2007

(87) PCT Pub. No.: WO2006/090051

PCT Pub. Date: Aug. 31, 2006

(65) Prior Publication Data
US 2008/0134501 A1 Jun. 12, 2008

(30) Foreign Application Priority Data
Feb. 23, 2005 (FR) ................................. 05 01816

(51) Int. Cl.
*H05K 3/02* (2006.01)
(52) U.S. Cl. .................. 29/846; 29/825; 29/852; 174/264
(58) Field of Classification Search ............ 29/825, 29/846, 852; 174/264
See application file for complete search history.

(56) References Cited

U.S. PATENT DOCUMENTS

| 3,264,402 | A | * | 8/1966 | Shaheen et al. | 174/264 |
| 4,383,363 | A | * | 5/1983 | Hayakawa et al. | 29/847 |
| 4,648,179 | A | * | 3/1987 | Bhattacharyya et al. | 29/832 |
| 4,738,746 | A | | 4/1988 | Clariou | |
| 5,595,943 | A | * | 1/1997 | Itabashi et al. | 427/97.7 |
| 5,950,306 | A | * | 9/1999 | Suzuki et al. | 29/852 |
| 6,711,802 | B2 | * | 3/2004 | Okamoto | 29/458 |
| 6,938,336 | B2 | * | 9/2005 | Ito et al. | 29/852 |
| 2004/0017408 | A1 | | 1/2004 | Cok | |
| 2004/0101666 | A1 | * | 5/2004 | Tsubosaki et al. | 428/209 |

FOREIGN PATENT DOCUMENTS

| EP | 0 241331 | 10/1987 |
| FR | 2 596230 | 9/1987 |
| WO | 2004 026977 | 4/2004 |

OTHER PUBLICATIONS

PCT International Search Report dated Jul. 3, 2006.

* cited by examiner

*Primary Examiner*—C. J Arbes
(74) *Attorney, Agent, or Firm*—Dickinson Wright PLLC

(57) ABSTRACT

The invention concerns a method which consists in coating uniformly the non-developable surface (6) with an electrically conductive material (9), which is in turn coated, by spraying, with a pattern (10) of polymerizable protective material, said pattern being polymerized as it is being formed, and then selectively eliminating, through the openings (10.8) of said pattern (10), the portions of said electrically conductive material (9) which do not over said electrically conductive patterns.

7 Claims, 2 Drawing Sheets

METHOD OF MAKING ELECTRICALLY CONDUCTIVE PATTERNS ON A SUBSTRATE

Figure 1:
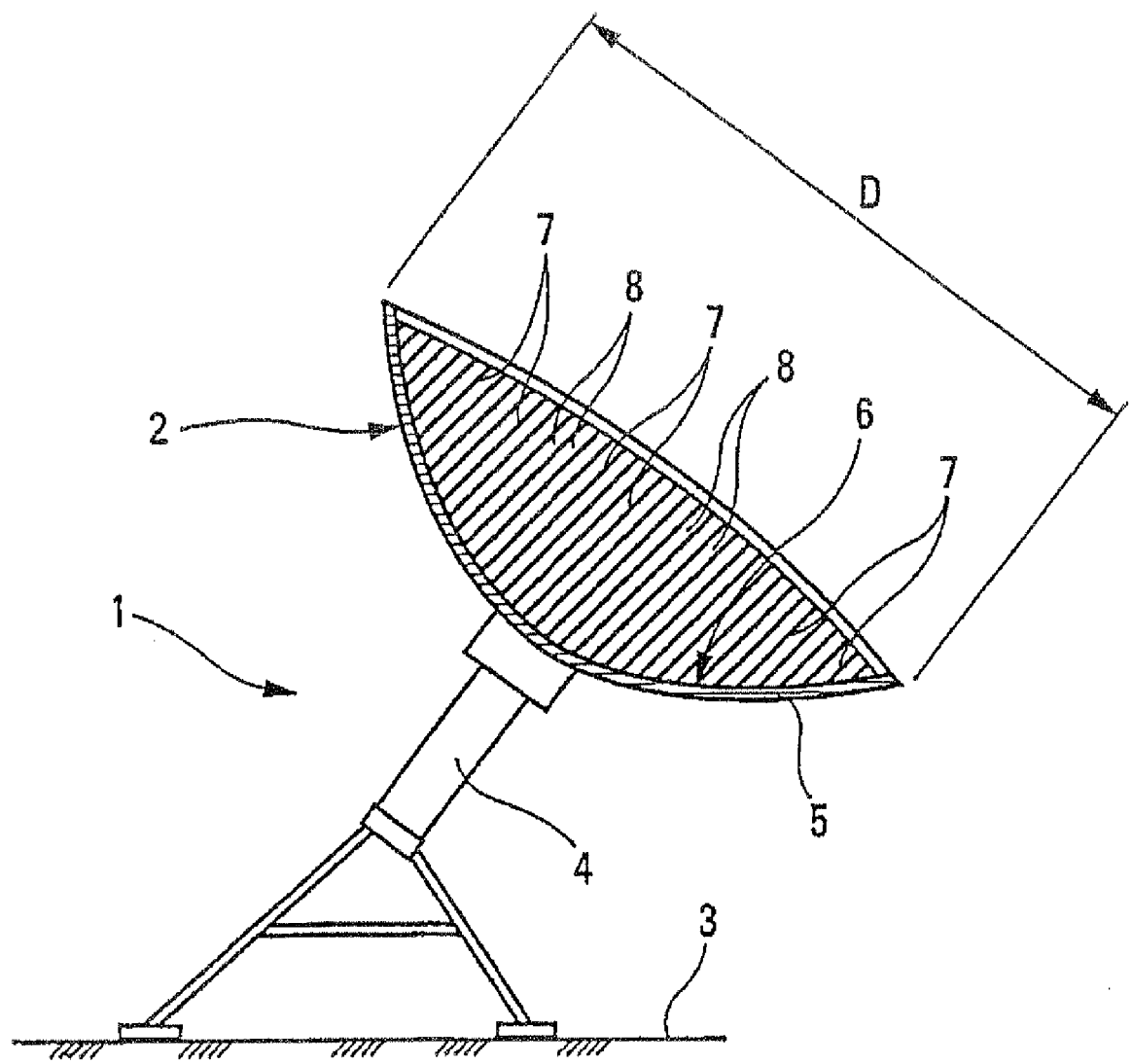

The present invention relates to a method for producing electrically conductive patterns on a surface of an insulating substrate.

Although not exclusively, it is particularly suitable for the production of a polarizing grid (frequency re-use antenna) or a series of resonant patterns (dichroic antennas) on a surface shaped at least approximately as a paraboloid, hyperboloid, etc. The invention also relates to devices comprising such a substrate, said non-developable surface of which carries said electrically conductive patterns which are produced according to the method.

It is known that in order to produce a printed circuit on a plane face of an electrically insulating substrate, said surface is first covered uniformly with a layer of a metal such as copper or aluminum, after which this metal layer is itself covered uniformly with a photosensitive product. The photosensitive product is subsequently exposed to a light beam, through a mask corresponding to the printed circuit to be obtained. Such exposure renders resistant the parts of the photosensitive product lying on top of the parts of the metal layer intended to form the printed circuit, so that suitable chemical attack subsequently makes it possible to remove selectively the portions of the photosensitive product which have not been rendered chemically resistant by the exposure, as well as the metal layer portions lying under them.

Following said chemical attack, the desired printed circuit is therefore obtained.

In the case in which it is desired to apply this method to the production of printed circuits on a surface which is no longer plane, but is a non-developable three-dimensional surface, difficulties would be encountered when applying the mask onto said surface. This is because for obvious reasons of convenience in production and precision, such a mask is plane. It would thus be necessary either to cut up said mask into pieces of smaller area and apply it by juxtaposing said pieces on said non-developable surface, or to make said mask from a flexible material which can be applied thereon by deformation. In both cases, the printed circuit obtained would be imprecise as regards both the shape and the position of the patterns which constitute it.

It will furthermore be noted that if, as a variant, said printed circuit is produced on a plane auxiliary substrate intended to be applied subsequently onto the non-developable surface, the same difficulties would be encountered as those mentioned above in respect of the masks.

In order to overcome these drawbacks and make it possible to produce precise printed circuits directly on non-developable three-dimensional surfaces, the method described in documents U.S. Pat. No. 4,738,746; EP-0 241 331 and FR-2 596 230 may be employed. In this method, just as in the one summarized above, said surface which is then a non-developable three-dimensional surface is initially covered uniformly with a layer of an electrically conductive material, which is in turn covered with a layer of a protective material. After forming said layers of conductive material and protective material, the contour of said patterns is traced mechanically on them by means of a tool which etches grooves whose depth is at least equal to the thickness of said protective layer, then said layers are subjected to the action of a chemical agent capable of selectively attacking said electrically conductive material without attacking said protective material, this chemical attack operation being continued over a sufficient time for said electrically conductive material to be removed over its entire thickness underneath said grooves, after which the parts of said electrically conductive material layer which lie outside said patterns are separated from the substrate by peeling.

By virtue of this latter method, it is thus possible to produce electrically conductive patterns directly on non-developable three-dimensional surfaces without having to resort to a mask or an auxiliary substrate with, which, moreover, it would be technically difficult to obtain patterns that are as precise in terms of both their shape and their position on said surfaces.

In such prior art, a tool provided with at least one etching tip or at least one cutting blade is used for tracing the contours of said electrically conductive patterns, said tool being mounted in a machine (for example with numerical control and five axes of rotation) responsible for moving it relative to the non-developable surface.

It is thus possible for devices with a non-developable surface carrying electrically conductive patterns to be produced in an easy and precise way. For example, carrying out this known method makes it possible to produce high-quality grid reflectors which are adapted to operate in the Ku band (from 11 to 18 GHz) and are formed by at least one network of parallel conductive wires, these conductive wires having a width of 0.25 mm, a thickness of 35 micrometers and being distributed with a pitch of 1 mm over a surface shaped least approximately as a paraboloid, the aperture diameter of which may reach 2300 mm.

This prior method, however, presents limitations of a technical and economic nature. If instead of a grid reflector intended to operate in the Ku band, for example, it is desired to produce such a reflector intended for the Ka band (from 20 to 30 GHz), then the width, thickness and distribution pitch of the conductive wires become smaller (for example respectively 0.125 mm, 18 micrometers and 0.5 mm) and this entails difficulties due to the smaller width and the smaller thickness of the conductive wires, and of the inter-wire zones:

- the tracing parameters of the conductive patterns (pressure and arrangement of the etching tips or blades) and the chemical attack parameters (duration) become more sensitive, which results in geometrical defects and weakening of the conductive wires during the peeling;
- edge effects become a significant when tracing the conductive wires, since the tips or the blades push back the thin conductive material in the manner of a ploughshare and reduce the adhesion of the conductive wires on the substrate; and
- the inter-wire zones are fragile and are therefore liable to break during the peeling.

As a consequence it is necessary to ensure that the tool always exerts perfect tracing, and the conduct of the method needs to be slowed, which increases the manufacturing costs of such a reflector.

Furthermore, document WO 2004/026977 has already disclosed a method for producing electrically conductive patterns on a surface of an electrically insulating substrate, according to which method:

- said surface is covered uniformly with a layer of an electrically conductive material;
- a template of said electrically conductive patterns is formed on said electrically conductive material layer by spraying a jet of protective material which is polymerizable under the action of radiations said template being provided with openings corresponding to said portions of said electrically conductive material layer to be removed; and
- the portions of said electrically conductive material layer which do not correspond to zones intended to form said patterns are removed selectively through said openings of the rigidified template, the zones of said electrically conductive material layer corresponding to said patterns being protected by said rigidified template during said selective removal.

Such a known method is thus similar to inkjet printing as regards the formation of said template, which obviates any contact with the layer of electrically conductive material during the production of said electrically conductive patterns, making it possible to avoid the drawbacks mentioned above regarding the method according to document U.S. Pat. No. 4,738,746.

Said polymerizable protective material needs to be relatively fluid in order that it can be sprayed, however, so that once sprayed onto said electrically conductive material layer it has a tendency to flow and spread thereon, which impairs the precision of said template and therefore that of said electrically conductive patterns.

It is an object of the present invention to overcome these drawbacks.

To this end, according to the invention the method as summarized above, in which polymerizable protective material is sprayed, is noteworthy in that in order to form and rigidify said template on said electrically conductive material layer, a mobile jet printing head and a mobile source of polymerizing radiation are used which are moved together relative to said electrically conductive material, layer in order to cover all its zones intended to form said electrically conductive patterns, the protective material constituting said template thus being polymerized as it is being formed on said electrically conductive material layer.

Said template is thus rigidified as it is being formed on the substrate, so that it can be produced with high precision.

Preferably, said protective material is of the type which is polymerizable by a beam of ultraviolet radiation. By way of example, such a protective material may be a resin which contains photoinitiators that crosslink under UV radiation, for example the one known commercially by the name FUN-JET or SERICOL.

In order to move said printing head and said radiation source together, it is advantageously possible to use a machine similar to the one mentioned above, intended for carrying out the prior method of document U.S. Pat. No. 4,738,746.

Said selective removal of the portions of said electrically conductive material layer, which do not correspond to said zones intended to form said patterns, is carried out with the aid of a chemical, agent capable of attacking the electrically conductive material without attacking said protective material.

Said chemical, agent may be iron perchloride, when said layer is made of copper.

After said selective removal of the portions of said electrically conductive material layer, which do not correspond to said zones intended to form said patterns, said template covering said electrically conductive patterns may either be removed or left in place.

From the preceding description, it will readily be understood that the invention may particularly advantageously be carried out to produce a device, for example a reflector, comprising an electrically insulating substrate carrying electrically conductive patterns on one of its surfaces, which is a non-developable three-dimensional surface. Specifically, in this case, parts of said substrate are inclined or vertical irrespective of the arrangement of said substrate during the spraying of the template, and this would promote flow and spreading of the sprayed material if the pattern was not solidified as soon as it is formed on said surface.

The figures of the appended drawing will clearly show how the invention may be embodied. In these figures, identical references denote similar elements.

FIG. 1 schematically represents an antenna device, the reflector of which is provided with electrically conductive patterns produced by carrying out the method according to the present invention.

Figure 2:
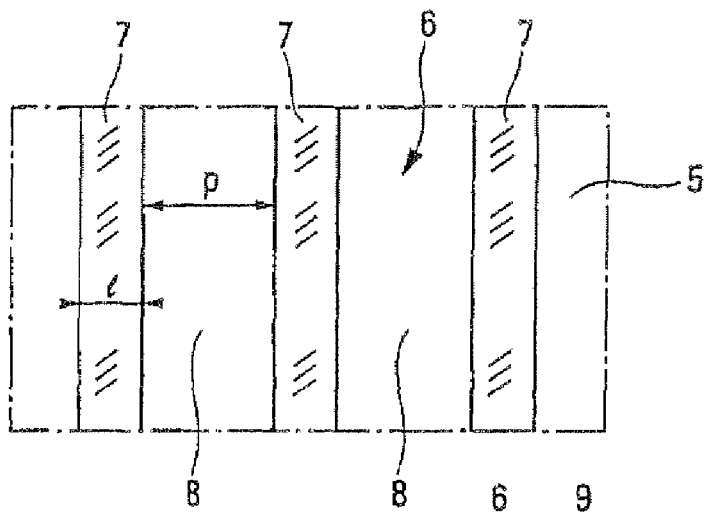

FIG. 2 is an enlarged schematic front view of a part of the reflector in FIG. 1, illustrating the shape and the arrangement of said electrically conductive patterns.

FIGS. 3A to 3D schematically illustrate steps of the method according to the present invention in section, applied to production of the electrically conductive patterns in FIGS. 1 and 2.

Although it is concave and not developable, in FIGS. 2 and 3A to 3D the reflector's surface carrying said electrically conductive patterns is represented as being plane for convenience of the drawing.

FIG. 1 schematically represents an antenna device 1 provided with an antenna reflector 2 (represented in diametral section) supported by a bearing surface 3 via a support 4.

The reflector 2 comprises an electrically insulating substrate 5 (for example made of composite material), whose surface 6 next to the support 4 is concave and has a non-developable shape, for example at least approximately the shape of a paraboloid, a hyperboloid, etc. On this non-developable three-dimensional surface the reflector 2 carries electrically conductive patterns, formed by mutually parallel and equidistant conductors 7 in the example represented. Each conductor 7 has a rectangular cross section of width 1 and thickness e, and the distribution pitch of the parallel conductors 7 is denoted by p. A separating zone 8 in the form of a strip, having a width equal to p, is thus formed between two adjacent conductors 7 (see also FIG. 2).

In order to produce the reflector 2 illustrated schematically by FIGS. 1 and 2, the non-developable surface 6 of the substrate 5 is first coated uniformly with a layer 9 of an electrically conductive material (see FIG. 3A) with a thickness equal to e. Such a layer 9 may, for example, be vacuum deposited on the surface 6 or attached thereon by adhesive bonding. It may be metallic and consist, for example, of copper or aluminum.

Figure 3A:
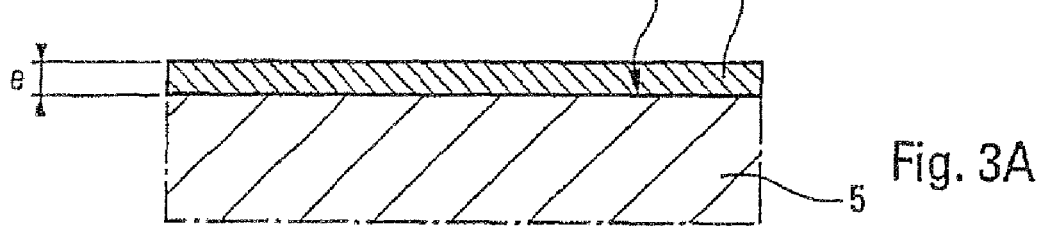
Figure 3B:
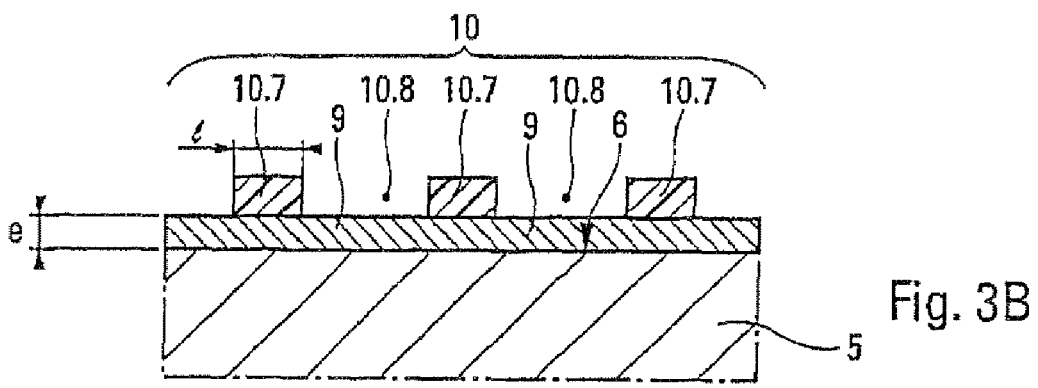

Next, with the aid of a mobile spray head similar to an inkjet printing head a template 10 for said conductors is formed on the electrically conductive material layer 9 with the aid of a polymerizable protective material. As shown by FIG. 3B, this template 10 comprises on the one hand line of protective material 10.7 with a width equal to 1, on top of the zones of the conductive layer 9 intended to form the conductors 7, and on the other hand openings 10.8 between said lines 10.7, (corresponding to portions of the conductive layer 9 to be removed in order to form the separating zones 8.

As the lines 10.7 of the mask 10 are being deposited on the conductive layer 9 by spraying, the material of said lines 10.7 is polymerized preferably with the aid of an ultraviolet radiation beam, in order to rigidify said mask 10 as soon as it is formed. To this end a mobile source of polymerizing radiation is used which is moved, together with said spray head, relative to the elastically conductive material layer 9.

After such rigidification the conductive layer 9 is subjected, through the openings 10.8, to the action of a chemical agent applied for example by spraying or immersion.

This chemical agent attacks the electrically conductive material layer 9 between the lines 10.7, without attacking said lines 10.7 of protective material. The chemical agent, which are then selectively removes the conductive layer 9, is for example iron, perchloride, when the layer 9 is made of copper.

Figure 3C:
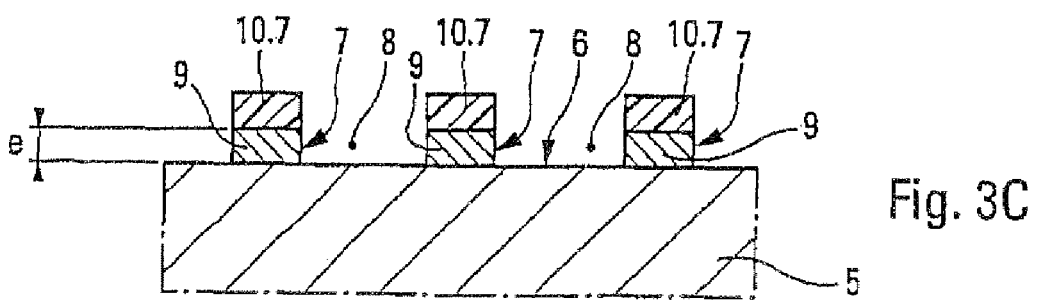

The action of the chemical agent on the conductive layer 9 is continued until the latter has been removed over its entire thickness underneath the separating zones 8 (FIG. 3C). This results in the formation of the conductors 7.

Rinsing is subsequently carried out on all of the substrate 5 and said partially cut layer 9.

Figure 3D:
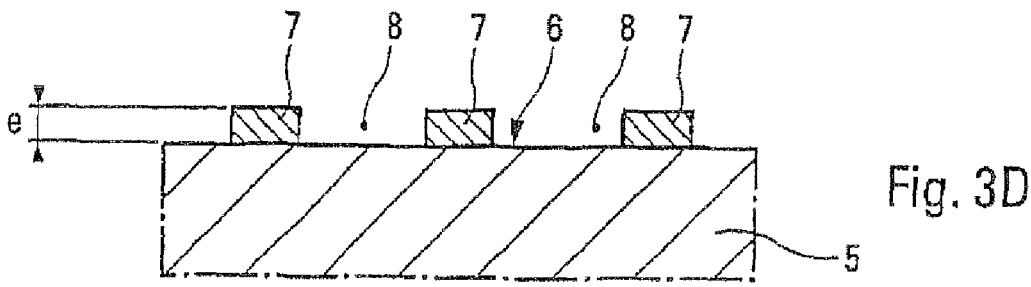

Optionally, the mask 10 (lines 10.7) covering the conductors 7 is furthermore removed (FIG. 3D). The protective material of the mask 10 may nevertheless be selected so that it has characteristics making it compatible with the environment (for example in space) when the reflector will, be needed to operate. The lines 10.7 of the mask 10 may thus required left in place on the conductors 7 and serve to protect them, for example against corrosion.

From the preceding description, it will be noted that the method according to the present invention is:

economical and fast, notably the fact that the speed of jet printing is very fast (for example 0.3 m/s) and that it is possible to use multiple printing heads simultaneously;

reversible, since a programming error of the machine or a printing anomaly can be corrected; the printing can be resumed after at least partial removal of the protective material already sprayed, without affecting the substrate 5 and the conductive layer 9;

robust, since it obviates the mechanical cutting of very fine patterns; and versatile, since it makes it possible to produce conductive patterns with varied shapes.

By way of example, it will mentioned below that carrying out the method according to the invention has made it possible to manufacture a reflector such as the one represented in FIGS. 1 and 2 with l=0.125 mm, p=0.5 mm and e=18 micrometers, the diameter D of the aperture of said reflector being equal to 2300 mm.

The invention claimed is:

1. A method for producing electrically conductive patterns on a surface of an electrically insulating substrate, said method comprising:

covering said surface uniformly with a layer of an electrically conductive material;

forming a template of said electrically conductive patterns on said electrically conductive material layer by spraying a jet of protective material which is polymerizable under the action of radiation, said template being provided with openings corresponding to portions of said electrically conductive material layer to be removed, wherein said template is formed and rigidified on said electrically conductive material layer utilizing a mobile jet printing head to spray said jet of protective material and a mobile source of polymerizing radiation by moving said mobile jet printing head and said mobile source of polymerizing radiation together relative to said electrically conductive material layer so as to cover all its zones intended to form said electrically conductive patterns and to polymerize the protective material constituting said template as it is being formed on said electrically conductive material layer; and selectively removing the portions of said electrically conductive material layer, which do not correspond to zones intended to form said patterns, through said openings of the template, after the template is rigidified, while the zones of said electrically conductive material layer corresponding to said patterns are protected by said rigidified template.

2. The method as claimed in claim 1, wherein said protective material is polymerizable under the action of ultraviolet radiation.

3. The method as claimed in claim 2, wherein said protective material is a resin which contains photoinitiators that crosslink under the action of ultraviolet radiation.

4. The method as claimed in claim 1, wherein said selective removal of the portions of said electrically conductive material layer, which do not correspond to said zones intended to form said patterns, is carried out with the aid of a chemical agent capable of attacking the electrically conductive material without attacking said protective material.

5. The method as claimed in claim 4, wherein the chemical agent which removes said conductive material layer is iron perchloride, when said layer is made of copper.

6. The method as claimed in claim 1, wherein after said selective removal of the portions of said electrically conductive material layer, which do not correspond to said zones intended to form said patterns, said template covering said electrically conductive patterns is removed.

7. The method as claimed in claim 1, wherein after said selective removal of the portions of said electrically conductive material layer, which do not correspond to said zones intended to form said patterns, said template covering said electrically conductive patterns is left in place.

* * * * *